Nov. 1, 1966 R. B. SEEDS 3,283,171

SEMICONDUCTOR SWITCHING DEVICE AND CIRCUIT

Filed Feb. 1, 1963

INVENTOR.
ROBERT B. SEEDS

BY [signature]

ATTORNEY

United States Patent Office 3,283,171
Patented Nov. 1, 1966

3,283,171
SEMICONDUCTOR SWITCHING DEVICE AND CIRCUIT

Robert B. Seeds, Sunnyvale, Calif., assignor to International Business Machines Corporation, New York, N.Y., a corporation of New York Filed Feb. 1, 1963, Ser. No. 255,496
8 Claims. (Cl. 307—88.5)

The present invention relates to a semiconductor device and to circuits utilizing same. More particularly, it relates to such a device capable of simulating relay type operation and which includes an excess base current collecting region.

The first electric computers used in industry utilized electromagnetic relays for their various logic and switching functions. The relay was and still is theoretically an ideal switching device since a signal applied to a control element gives an absolute switching function to a controlled circuit, thus, the various problems of fan-in fan-out noise and so forth could be practically eliminated since a closed relay is virtually a zero resistance device and there are no noise sources which would tend to complicate designs. The advent of the electronic computer initially using electron tubes for switching and logic constituted a considerable improvement in speed and general reliability over the old or original electromagnetic or relay type of computers. However, the modern trend towards solid state, and in particular transistorized computers, has led to many problems in the development of switching and logic circuits. Although the transistor is inherently only a fraction of the size of either the electromagnetic relay or the electron tube and requires far less power for operation, many circuit compromises must be made to allow for the peculiarities of the transistor itself. For example, in a transistor the inputs and outputs are not isolated in the same way that an electromagnetic relay or even a vacuum tube may be isolated, thus, base current in the transistor flows in the emitter circuit adding to the collector currents. In a cascaded string of transistors the various emitter currents are different depending upon the location of the transistor in the string relative to ground. Thus, in a saturated string of four such transistors one would have an emitter current equal to $I_c+4I_b$ for the bottom transistor.

A number of attempts have been made in the past to utilize a series of cascaded transistors in a simulated relay type of logic; however, with the above mentioned difficulty, the interaction of all of the base currents from the respective saturated transistors cascaded together have made the electrical design quite difficult. Also with such a string of cascaded transistors the output must be taken from the collector end to avoid errors caused by base current noise. This circuit configuration obviously requires an inverter to get a true output of the circuit.

In summary, the circuit design considerations are so extremely involved when building a simulated relay type logic configuration from conventional three layer transistors and the device tolerances are so narrow that such circuitry has never received serious consideration in spite of the many attractive logic configurations possible.

It has now been found that by adding a fourth region adjacent to the collector layer of an otherwise fairly standard three layer transistor and by reverse biasing the junction formed thereby many of the problems due to the base current flow in the transistor can be eliminated. This fourth region collects the minority carriers injected into the normal transistor collector from its base during saturation and by sweeping them out of the collector greatly reduces the time for the transistor to be switched from saturation to turn-off. Thus, improvements in both electrical design and performance are realized. The device is further well adapted to modularization or the technique of packing a large number of active circuit components in a single very compact unit.

It is accordingly a primary object of the present invention to provide a semiconductor device capable of performing simulated relay type switching while avoiding many of the disadvantages of prior art devices.

It is a further object to provide such a device wherein means are provided to obviate the harmful effects of excess base current flow at saturation.

It is another object to provide circuits utilizing the device to perform switching operations.

It is a still further object to provide a unitary or modular device wherein a large number of such switching elements may be conveniently fabricated as a unitary structure.

The foregoing and other objects, features and advantages of the invention will be apparent from the following more particular description of preferred embodiments of the invention, as illustrated in the accompanying drawings.

Figures 3A, 3B:
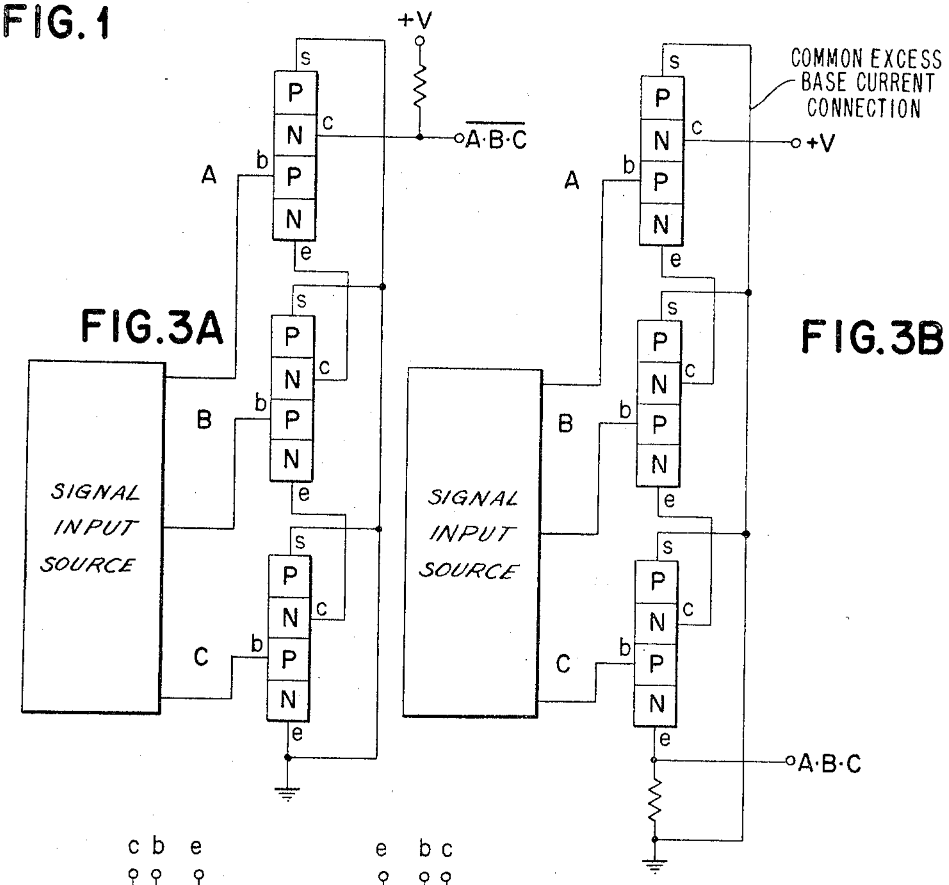
Figure 4:
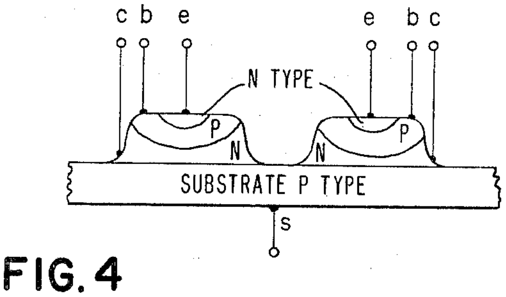

FIGURES 3*a* and 3*b* are schematic diagrams respectively of an AND-INVERT and an AND circuit utilizing devices of the present invention, and FIGURE 4 is a cross-sectional view showing actual construction details of a portion of a module utilizing the teachings of the present invention.

The objects of the present invention are accomplished in general by a transistor having at least an emitter, base and collector wherein there is provided adjacent the collector region and forming a rectifying junction therewith a fourth region of opposite conductivity type to said collector region, said junction being sufficiently close to the base-collector junction to function as an excess base current trap and means provided for directly connecting said region to the emitter or some point of potential that will maintain the collector-sink junction reverse biased.

It is to be understood that the term "excess base current" refers to that current due to minority carrier injection from the base to the collector when the transistor is biased to saturation. In saturation, this current is relatively large while in the unsaturated condition it is negligible. Also, the excess base current collector region will be referred to as the "base current sink" for simplicity in the remainder of the specification.

This junction may be created in any number of ways well known in the art, such for example, as by diffusion from an alloy dot or by epitaxial growth, etc. The result is a four layer device of alternately doped regions which differs considerably from the well known four layer Shockley hook transistor. The primary physical differences are in the doping levels, collector widths, injection efficiencies and the device alphas ($\alpha$).

The standard Shockley transistor intends to give a two terminal negative resistance characteristic and does so by employing the two extreme junctions in a forward biasing mode of operation. It injects minority carriers toward the center junction which acts as a collector for both requiring high alphas and injection efficiencies for these two common collector junction transistors.

The device of this invention employs one extreme junction as emitter and the other as a collector and the center junction as a collector for the former and an emitter for the latter. To optimize alphas for this type of operation requires entirely different relative doping levels as well as junction geometry and, in fact, results in a structure which probably would not exhibit a negative resistance characteristic if used as a two terminal device.

The collector region of the device of this invention will also be several times thicker than the base region to allow for minimizing the collector spreading resistance. In the Shockley device, these regions would be of the same thickness.

The invention will now be particularly pointed out and explained with reference to the accompany drawings, wherein the transistor of FIGURE 1 constructed in accordance with the present invention comprises an emitter 10, a base 12, a collector 14 and base current sink region 16 adjacent the collector. The Figure illustrates the currents which flow in the external circuitry and the way in which the terminals are connected in order for the transistor to operate in saturated circuitry. Constructing a transistor in the fashion to be more fully set forth and described below and connecting it in the manner illustrated in FIGURE 1 significantly reduces the amount of base current which will flow in the emitter circuitry of the transistor when saturated and will significantly reduce the time for said saturated transistor to be cut off. The amount of base current which flows out of the emitter is only that required to sustain the collector current and is normally a very small fraction of said collector current. The excess base current which corresponds to minority carriers injected into the collector flows out a terminal marked S and then directly to ground and need not mix with the emitter current, as will be seen subsequently.

Figures 1, 2:
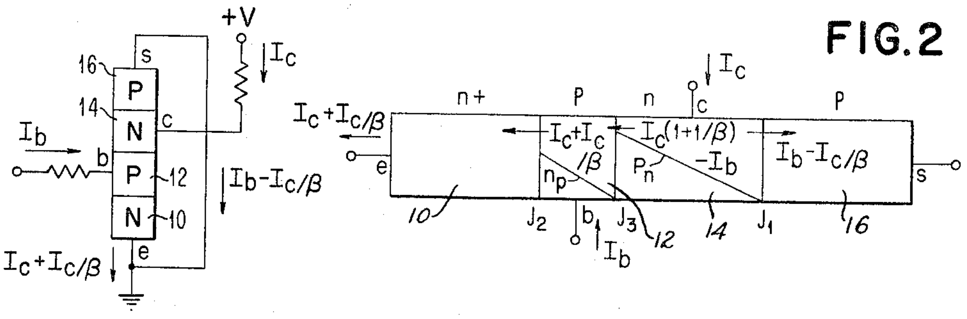
FIGURE 1 is a schematic diagram of a simplified switching circuit utilizing a single semiconductor element constructed in accordance with the present invention and illustrating in a general way the various current paths in such a circuit.
FIGURE 2 is a diagram illustrating minority carrier distribution and the junction currents in the device of FIGURE 1.

FIGURE 2 shows the minority carrier distributions in the device and the junction currents which help to explain the principles of operation. In this Figure, the lower portion of the base and collector regions 12 and 14 respectively indicate the relative quantity of minority carriers injected into these regions and will be seen to be greater near the base-collector junction in the collector region and near the base emitter junction in the base region respectively.

An electron current equal to $I_c$ flows across the collector junction $J_1$. Thus, an electron current $I_c$ plus its recombination current $I_c/\beta$, wherein $\beta$ is the unsaturated grounded emitter current gain of the npn transistor, flows across the emitter junction $J_2$. It is required of a device constructed in accordance with this invention that the base be much more heavily doped than the collector so that any excess base current will appear mostly in the form of holes injected into the collector region when the base-emitter junction becomes forward biased. The collector layer is always reversed biased with respect to the p type "sink" layer and if the junction is in close proximity to the collector-base junction $J_3$, then most of the "hole" current which flows across the base-collector junction will then flow out the sink terminal. Thus, electrons are emitted into the base and collected by the collector while holes are emitted into the collector and collected by the sink region 16. In most saturated circuitry wherein npn transistors are used, the emitters are never connected to a potential lower than ground, and in this case it is sufficient to connect the sink terminal directly to ground.

Referring to the AND circuit of FIGURE 3*b*, the advantage of such devices is a cascaded emitter-follower AND circuit is that if transistor A is turned off, the base current drives of transistors B and C will flow in the sink circuit and will not cause noise in the output circuit. In other words, the sink region provides a path for base current during saturation of B and C when transistor A is not "on." In a string of ordinary three layer transistors excess base current drive causes unpredictable results, such as noise, etc. If a great deal of branching above transistor C occurs, this is very important, since the amount of extraneous base current could easily exceed that required to give a "true" output indication. The transistor of the present invention including the base current sink region also has particular utility in the cascade AND-INVERT circuit of FIGURE 3*a*. Firstly, it causes the collector currents in all of the transistors to be about equal since the excess base current is collected in each transistor and is passed off into the common sink circuit. The use of such a sink region further provides a means of controlling minority carrier storage in the collector region which results in satisfactorily low storage times without having to control life time in the transistor by other means.

In summation, the use of the present invention accomplishes the following two major advantages.

Firstly, in saturated transistors excess base current does not flow out the emitter. And secondly, in saturated transistors low storage times can be realized without killing the life time.

While the above invention has been described with respect to a modified npn transistor wherein an additional p region is deposited on the collector, it is to be understood that the explanation holds true equally well for a pnp transistor with an additional n region deposited adjacent the p type collector. Similarly, although the discussion of FIGURES 3*a* and 3*b* both show cascaded transistors constructed in accordance with the invention cascaded in AND circuit configuration, it is to be understood that such transistors would have equal value in parallel connection as with an OR circuit, or for that matter, any other application where excess base current became a problem when the transistors are operating at saturated levels.

The primary criteria in constructing a transistor according to the present invention is that the base region must be considerably more heavily doped than the collector region and the base current "sink" junction must be sufficiently close to the base-collector junction in order to attract the injected minority carriers and sweep them out of the collector. The doping level of the "sink" region is not critical except that it should be kept as low as possible to reduce junction capacitance. Characteristic doping levels for typical transistors constructed in accordance with the invention are approximately $2\times10^{18}$ atoms of impurity material/cc. of semiconductor material in the base region and approximately $2\times10^{16}$ atoms of impurity material/cc. of semiconductor material in the collector region. Collector widths should be between 2 and 5 times the base width for optimum sweeping of the minority carriers from the collector.

As stated previously, a single transistor may be fabricated according to the present invention in a number of ways including both diffusion and epitaxial deposition and/or any combination of these, plus other well known methods of producing rectifying junctions well known in the semiconductor art.

Two examples illustrating how a four layer transistor having a base current "sink" region is made follow.

*Example I*

In this example, a bar of highly doped p type silicon was placed in a conventional tubular vacuum furnace having heating coils provided at different locations therein as is well known in the art to vaporize the materials being used in the epitaxial deposition or diffusion steps of transistor fabrication. Next, a source of silicon containing n type conductivity type determining impurities therein was vaporized and caused to deposit an epitaxial layer on the p type substrate. The conductivity type determining impurity in this region was arsenic. Next, the base and the emitter areas were formed in the n type wafer by conventional double diffusion methods using fairly conventional masking techniques. Finally, a mesa etch was employed to limit the area of the epitaxial or collector sink junction. The p type base region was obtained with a boron diffusion and the $n^+$ type emitter region was obtained by using a phosphorus diffusion. The epitaxial layer on this transistor was about 6 microns thick. The base diffusion was approximately 2.5 microns deep, leaving a collector width of approximately 3.5 microns. The emitter diffusion into the base region was approximately 1.5 microns deep, leaving a base width of 1 micron and an emitter width of 1.5 microns. In this transistor, the $n^+$ type conductivity type determining impurity in the emitter was phosphorus doped to a level of approximately $2\times10^{20}$ atoms of conductivity type determining impurity per cc. of silicon. The p type (boron diffused) base region was doped to a level of approximately $2\times10^{18}$ atoms of conductivity type determining impurity per cc. of silicon. The n type (arsenic doped) epitaxial layer or collector region was doped to a level of approximately $2\times10^{16}$ atoms of conductivity type determining impurity per cc. of semiconductor material and the p type silicon substrate was doped to a level of approximately $5\times10^{14}$ atoms of p type conductivity determining impurity per cc. of silicon. Emitter, base, collector and sink contacts were connected to the npnp regions of the device respectively and the device was tested and found to have substantially reduced turn-off times after a heavily saturating base current drive was applied to the base terminal and exhibited lower excess minority carrier storage or excess base currents in the emitter circuit path during saturation.

*Example II*

A second npnp four layer transistor structure embodying the teachings of the present invention was made in a manner very similar to that of Example I. In this example, the resultant structure had a total n type epitaxial layer thickness of approximately 6 microns. The base diffusion had a diameter of about 12 mils and was 2.8 microns deep. The emitter diffusion had a 4 mil diameter and was about 1.5 microns deep, giving a total collector width of 3.2 microns and a base width of 1.3 microns. The n type epitaxial layer was doped to a level of somewhat less than the $2\times10^{16}$ atoms of conductivity type determining impurity per cc. of silicon of Example I. The same doping materials were used as in Example I and the doping densities were approximately the same with the exception of the collector doping level as stated above. Tests were run on this transistor and it was found to behave in the manner predicted, i.e., that a drain current flowed when the transistor was saturated. For example, with a collector current of 0.5 milliamp and a base current of 0.5 milliamp, a sink current of 0.23 milliamp was observed. This agreed precisely with the sink current predicted with the npn and pnp $\alpha$'s which were measured on this device. With alphas close to unity the sink current would have been very nearly 0.5 milliamp.

While collector widths $W_c$ of 3.2 and 3.5 have been illustrated in the two examples, it is to be understood that the actual $W_c$ which could be used, would depend upon a number of factors, but mainly on the trade-off between the pnp $\alpha$ desired and the npn collector spreading resistance that can be tolerated, and that the relative doping levels between the base and collector are also subject to a certain amount or design variation. The primary requirement is that the base be more heavily doped than the collector. Relative to the collector width $W_c$, as stated above, this region must be sufficiently narrow that the reverse biasing effect of the collector-sink junction is enabled to sweep the injected minority carriers out of the collector and into said sink region.

FIGURE 4 shows a further extension of the present invention in which a plurality of devices constructured in accordance with the present invention can readily be made, as a modular structure incorporating a fairly large number of such devices in a small area. In this embodiment, a plurality of wafers of n type material are grown by epitaxial deposition of a p type silicon substrate. Subsequently, a double diffusion creates the emitters and bases on the respective n type wafers. It will be noted in the drawing that the emitters, bases and collectors on each wafer are marked respectively *e, b, c* and that the substrate, which is labeled *cs* for common sink, is common to all of the individual transistor wafers. Since all of the sink regions are normally directly connected together, as in the circuit example of FIGURES 3*a* and 3*b*, and the individual transistors are electrically isolated, there is no necessity to cut the individual transistors from the common substrate. In this device, the p type substrate is, of course, the common sink region and constitutes a p type fourth layer on an npn transistor. As stated above relative to the single transistors described, this embodiment could also be constructed using an n type substrate and pnp transistors deposited on the top surface thereof.

A modular device constructed in accordance with FIGURE 4 would be made in substantially the same manner as the single devices of Examples I and II above. The primary difference would be in the use of a larger starting substrate and utilizing plural masking and/or etching to produce a plurality of wafers on the substrate and then using plural masking for the subsequent double diffusion operations to form the base and emitter regions.

While the invention has been particularly shown and described with reference to preferred embodiments thereof, it will be understood by those skilled in the art that various changes in form and details may be made therein without departing from the spirit and scope of the invention.

What is claimed is:

1. A simulated relay type transistor switching element comprising a four layer transistor defining emitter, base, collector and base current sink regions in that order respectively, bias means for maintaining the base-collector and collector-base current sink junction reverse biased when said transistor is saturated, said collector region being between about 2 and 5 times the width of said base region whereby minority carriers injected into said collector by said base will be swept into said base current sink region by a drift field set up by the collector-base current sink bias, and means for selectively biasing said base region to the cut-off and saturated level.

2. A four layer transistor comprising:

emitter, base, collector and base current sink regions in that order respectively, wherein the sink region comprises high resistivity p type silicon, the collector comprises an epitaxial layer of n doped silicon and the base and emitter electrodes comprise boron and phosphorous diffused regions respectively in said n type wafer wherein the n type epitaxial collector wafer is arsenic doped to a level of approximately $2\times10^{16}$ atoms of conductivity type determining impurity per cc. of silicon, the base region is boron doped to a level of approximately $2\times10^{18}$ atoms of conductivity type determining impurity per cc. of silicon, the emitter is heavily doped with $n^+$ type phosphorous to a level of approximately $2\times10^{20}$ atoms of conductivity type determining impurity per cc. of silicon, the base current sink region is doped to a level of approximately $5\times10^{14}$ atoms of p type conductivity determining impurity per cc. of silicon, means to connect each of said emitter, base and collector regions to external circuitry to operate said regions as a conventional transistor, and potential means connected to said sink region to maintain the collector-sink junction in a condition of reverse bias.

3. A transistor simulated relay type logic circuit comprising a plurality of four layer transistors each comprising:

emitter, base, collector and base current sink regions in that order therein, said transistors being connected in a series string such that the emitter of the first transistor is connected to ground and the collector and emitter of subsequent transistors are connected together and the collector region of the last transistor in the string is connected to a source of potential for reverse biasing the base-collector junction of that transistor, means connecting all of said base current sink regions to a potential for maintaining each of the collector-base current sink junctions reverse biased at all times, and separate means connected to the base electrodes of each of said plurality of transistors for selectively driving each of said transistors into saturation and cut-off whereby when any one of said plurality of transistors is biased to cut-off there will be substantially zero current flowing in the emitter-collector circuits of said series string of transistors and load means connected in the emitter-collector current path of said series string of transistors for providing an output indication of the conductivity state of said string.

4. A simulated relay type logic circuit as set forth in claim 3 wherein all of the base current sink regions are directly connected to ground.

5. A simulated relay type logic circuit as set forth in claim 3 wherein said load resistor is located between the collector of the last transistor in the string and the source of biasing potential for said collector electrode, the output signal being taken between said collector electrode and ground to provide an AND-INVERT function.

6. A simulated relay type logic circuit as set forth in claim 3 wherein the load resistor is in series circuit arrangement between ground and the emitter of the first transistor and the output is taken between the emitter of said first transistor and ground and provides an AND circuit configuration.

7. A modular transistor structure comprising:

a plurality of four layer transistors each comprising emitter, base, collector and base current sink regions wherein said sink region is located adjacent to the collector region, is of opposite conductivity type thereto and forms a junction therewith opposite from the base-collector junction, said sink region being common to the plurality of transistors and comprising a high resistivity substrate having a plurality of discrete epitaxial wafers deposited upon discrete areas of the surface thereof forming collector regions for each of the plurality of transistors and wherein base and emitter regions are diffused into said collector regions by suitable means, and means are provided for making ohmic contacts to each of the emitter, base and collector electrodes and also to the common sink electrode, and wherein each of the base regions is more heavily doped than its respective collector region and the respective collector widths are sufficiently narrow so that minority carriers injected from the base region into the collector region will be swept across said collector region and into the sink region during saturated operation of each of said devices.

8. A modular transistor structure as set forth in claim 7 wherein the collector region width is between about 2 and 5 times the base region width.

References Cited by the Examiner

UNITED STATES PATENTS

| | | | |
|---|---|---|---|
| 2,655,610 | 10/1953 | Ebers | 307—88.5 |
| 2,809,135 | 10/1957 | Koury | 148—1.5 |
| 2,851,594 | 9/1958 | Herold | 250—20 |
| 2,938,130 | 5/1960 | Noll | 307—88.5 |
| 3,151,254 | 9/1964 | Feissel | 307—88.5 |

JOHN W. HUCKERT, *Primary Examiner.*

DAVID J. GALVIN, *Examiner.*

R. SANDLER, *Assistant Examiner.*